US007833055B2

(12) United States Patent
Crooijmans et al.

(10) Patent No.: US 7,833,055 B2

(45) Date of Patent: Nov. 16, 2010

(54) AUDIO PLUG WITH COSMETIC HARD SHELL

(75) Inventors: Wilhelmus M. C. Crooijmans, San Jose, CA (US); Kurt Stiehl, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/218,450

(22) Filed: Jul. 14, 2008

(65) Prior Publication Data

US 2010/0009575 A1 Jan. 14, 2010

(51) Int. Cl.
*H10R 13/58* (2006.01)

(52) U.S. Cl. ....................................... 439/604; 439/669

(58) Field of Classification Search ................. 439/731, 439/687, 447, 352, 417, 449; 156/242
See application file for complete search history.

(56) References Cited

U.S. PATENT DOCUMENTS 4,457,797 A * 7/1984 Hatchadoorian et al. .... 156/242
5,906,511 A * 5/1999 Bozzer et al. ............... 439/579
7,422,469 B1 * 9/2008 Chang ......................... 439/449
2007/0178771 A1 * 8/2007 Goetz et al. ................. 439/669
2008/0318629 A1 * 12/2008 Inha et al. ................... 455/557

* cited by examiner

*Primary Examiner*—Neil Abrams
*Assistant Examiner*—Phuong Nguyen
(74) *Attorney, Agent, or Firm*—Kramer Levin Naftalis & Frankel LLP

(57) ABSTRACT

Apparatus, systems and methods for assembling an audio plug with a cosmetic hard shell are provided. A plug may be coupled to a cable. An inner member may be molded about an end portion of the plug and an end portion of the cable. A strain relief member may be molded about a portion of the cable such that the strain relief member is adjacent to and substantially flush with the inner member. The seam between the inner member and the strain relief member may be covered by coupling a hard, smooth outer shell over a portion of the inner member and a portion of the strain relief member. Each of the inner member, the strain relief member, and the outer shell may be formed by injection molding, be of a cylindrical shape, and be formed from the same or different materials.

30 Claims, 5 Drawing Sheets

AUDIO PLUG WITH COSMETIC HARD SHELL

FIELD OF THE INVENTION

This invention can relate to apparatus, systems and methods for assembling an audio plug with a cosmetic hard shell.

BACKGROUND OF THE DISCLOSURE

Electronic devices provide audio to headphones using different approaches, including using audio plugs inserted into a jack of the electronic device. Many existing audio plugs are encased in a soft plastic cover (e.g., between the plug portion and a cable). The soft plastic cover may be susceptible to damage or allow undesired access to the internal electrical connections of the plug. In addition, the soft plastic cover may not be cosmetically appealing if it is soiled through normal use by a user of the audio plug.

Therefore, it would be beneficial to provide an audio plug with a hard shell to better protect the components of the audio plug while maintaining the same outer diameter as an audio plug having a soft outer cover. In addition, it may be beneficial to provide an audio plug with a hard shell that has a smooth exterior for enhancing the cosmetic appearance of the plug.

SUMMARY OF THE DISCLOSURE

An audio plug with a hard outer shell is provided in accordance with some embodiments of the invention.

The outer shell may be formed from any suitable material, such as PCB ABS or Dow 5200 HF, and be of any suitable shape to protect the electrical connection between a plug and a cable while also providing a hard, smooth, and cosmetically appealing surface. The outer shell may be of any suitable diameter within the range of 1.0 millimeters to 8.0 millimeters, for example 4.95 millimeters. The audio plug assembled with the outer shell may be used with any suitable electronic device to transmit audio to a user of the electronic device. For example, the electronic device may include a media player, such as an iPod™ classic, an iPod™ nano, or an iPod™ touch available by Apple Inc. of Cupertino, Calif., a cellular telephone, such as an iPhone™ available by Apple Inc., a device capable of communicating wirelessly (with or without the aid of a wireless enabling accessory system) or via wired pathways (e.g., using traditional electrical wires), a pocket-sized personal computer such as an iPAQ Pocket PC available by Hewlett Packard Inc. of Palo Alto, Calif., a personal digital assistant ("PDA"), or a personal e-mail or messaging device with audio and/or video capabilities (e.g., a Blackberry® or a Sidekick®).

In some embodiments of the invention, the audio plug may be assembled with one or more intermediate components disposed underneath the outer shell. For example, a plug may be coupled (e.g., soldered) to a cable including any suitable number of wires. An inner member may be molded about an end portion of the plug and about an end of the wires adjacent to the plug to protect the joint (e.g., the solder joint). The inner member may extend longitudinally along the plug and the cable. A strain relief member may be molded about a portion of the wires such that the strain relief member is adjacent to and substantially flush with the inner member, thereby forming a seam. The strain relief member may also extend longitudinally along the cable and may have a similar thickness to the inner member. The seam between the inner member and the strain relief member may be covered by molding or coupling a hard outer shell in a longitudinal direction over a portion of the inner member and a portion of the strain relief member opposing end portions of each of the inner member and the strain relief member (e.g., the end portion of each of the inner member and the strain relief member furthest from the seam) may be exposed beyond the edges of the outer shell. In some embodiments of the invention, each of the inner member, the strain relief member, and the outer shell may be formed by a two-shot molding process. In some embodiments of the invention, each of the inner member, the strain relief member, and the outer shell may form a cylindrical shape and each may be formed from the same or different materials.

In some embodiments of the invention, the plug and the cable may be coupled together and carried by a fixture while the audio plug is being assembled with intermediate components and a cosmetic hard shell. The fixture may include an integral testing component that may provide testing to confirm the electrical connection between the plug and the cable during the assembly process.

BRIEF DESCRIPTION OF THE DRAWINGS

The above and other aspects and advantages of the invention will become more apparent upon consideration of the following detailed description, taken in conjunction with the accompanying drawings, in which like reference characters refer to like parts throughout, and in which.

DETAILED DESCRIPTION OF THE DISCLOSURE

Apparatus, systems and methods for assembling an audio plug with a cosmetic hard shell are provided and described with reference to FIGS. 1-5.

Figure 1:
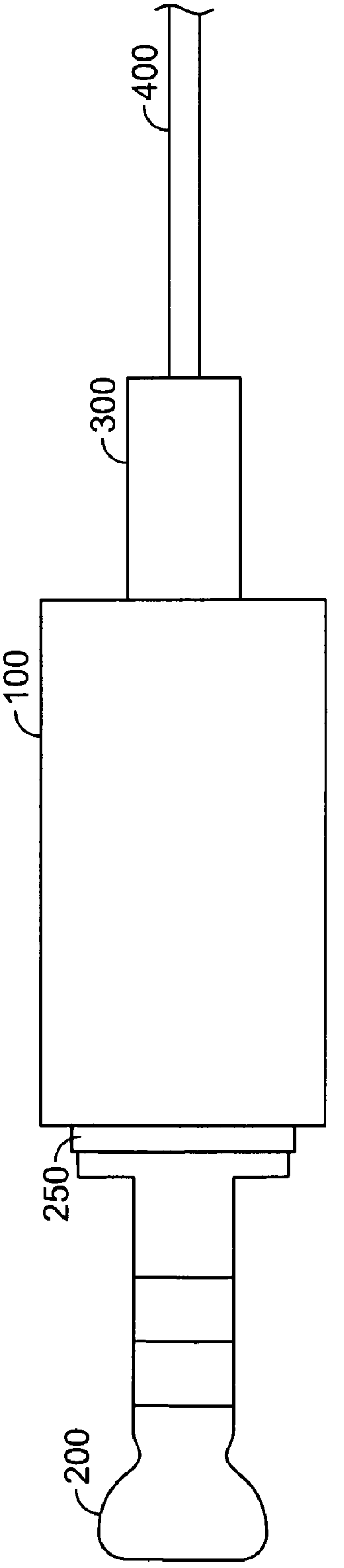
FIG. 1 shows a perspective view of an audio plug with a cosmetic hard shell in accordance with some embodiments of the invention.

FIG. 1 shows a perspective view of an audio plug with a cosmetic hard shell in accordance with some embodiments of the invention. Outer shell 100 may be constructed from any suitable hard material, such as a hard plastic, metal, composite material, ceramic, or any other suitable hard material. For example, outer shell 100 may be constructed from PCB ABS or Dow 5200 HF, and be of any suitable shape to protect the electrical connection between plug 200 and cable 400 while also providing a user with a hard, smooth, cosmetically appealing surface. Outer shell 100 may cover (e.g., be placed around) a seam between inner member 250 and strain relief member 300 while permitting a portion of each of inner member 250 and strain relief member 300 to be exposed beyond the edges of outer shell 100. Each of outer shell 100, inner member 250, and strain relief member 300 may include the same or different materials, be cylindrical in shape, and be formed by injection molding. In some embodiments, inner member 250 and strain relief member 300 may be located entirely within outer shell 100.

Figure 2A:
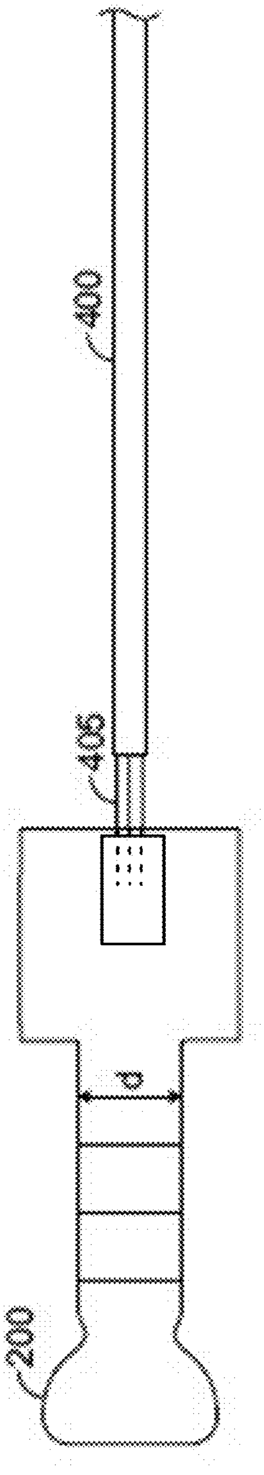
FIG. 2A shows a side view of a plug coupled to a coated cable in accordance with some embodiments of the invention.

FIG. 2A shows a side view of a plug coupled to a coated cable in accordance with some embodiments of the invention. Plug 200 may be constructed from any suitable material and may be of any suitable shape to be coupled with an electronic device (not shown) to transmit audio media to a user of the electronic device. Plug 200 may include several conductive regions (e.g., constructed from a conduction material, such as metal) and several isolating regions separating the conductive regions (e.g., constructed from plastic). Plug 200 may be of any suitable diameter d within the range of 0.5 millimeters to 7.5 millimeters, for example diameter d may be equal to 3.5 millimeters. Plug 200 may be coupled to cable 400 using any suitable approach. For example, each conductive portion of plug 200 may be coupled to a distinct smaller wire 405 using any suitable approach that provides for electrical conductivity (e.g., soldering). Cable 400 may be coated with any suitable coating, such as a soft plastic coating to protect and electrically isolate smaller wires 405 while allowing cable 400 to bend in response to an external force. Cable 400 may be coupled to plug 200 to transport audio to the electronic device from a secondary device (e.g., a microphone) for use by a user of the secondary device. Alternatively, cable 400 may transport audio from the electronic device to a secondary device (e.g., headphones) for use by a user of the electronic device.

Figure 2B:
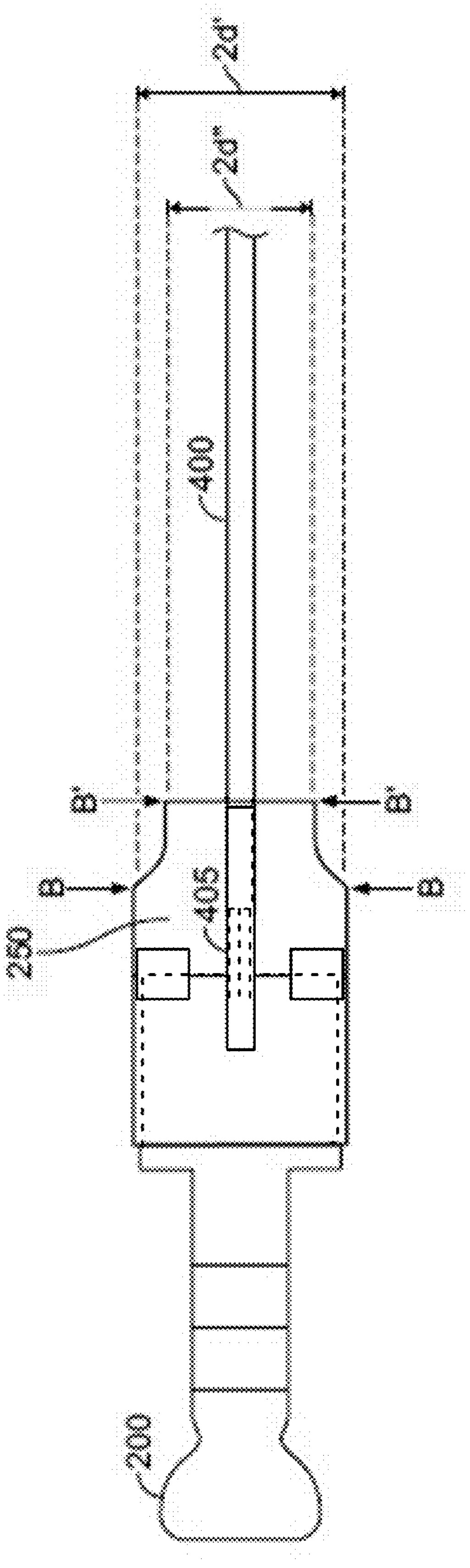
FIG. 2B shows a side view of an inner member formed around the plug coupled to the coated cable of FIG. 2A in accordance with some embodiments of the invention.

FIG. 2B shows a side view of an inner member formed around the plug coupled to the coated cable of FIG. 2A in accordance with some embodiments of the invention. Inner member 250 may be constructed from any suitable material, such as, for example, plastic, ceramic, composite material, or any other suitable non-conductive material. For example, inner member 250 may be constructed from a plastic having a melting point lower than the melting point of the material used to form outer shell 100 (FIG. 1). Inner member 250 may be of any suitable shape to protect the coupling of plug 200 to cable 400 and may extend longitudinally along a portion of plug 200 and a portion of cable 400. For example, inner member 250 may be cylindrical with an external diameter 2*d*' where inner member 250 is disposed over an end of plug 200 and the joint between plug 200 and cable 400. External diameter 2*d*' may be of any suitable diameter within the range of 0.6 millimeters to 7.6 millimeters, for example external diameter 2*d*' may be equal to four millimeters. Between line B-B and line B'-B', inner member 250 may be of any suitable second external diameter 2*d*" within the range of 0.6 millimeters to 7.6 millimeters. In some embodiments, second external diameter 2*d*" may be equal to external diameter 2*d*'. In some embodiments, inner member 250 may narrow in diameter where inner member 250 is disposed over cable 400 such that second external diameter 2*d*" may be less than external diameter 2*d*'. By creating inner member 250 with a smaller diameter, the profile of outer shell 100 may be reduced.

Figure 3:
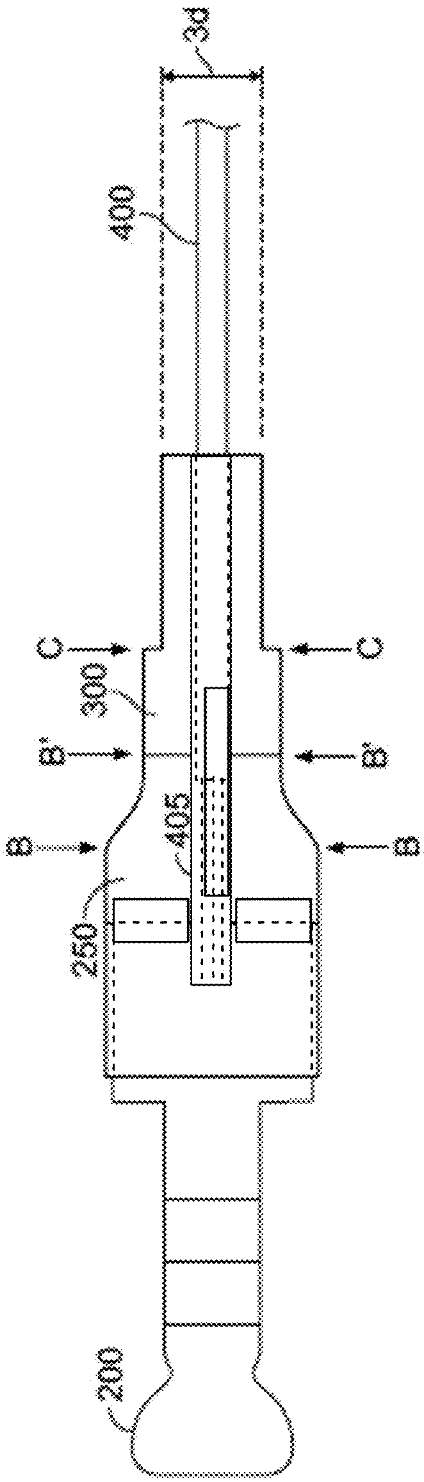
FIG. 3 shows a side view of a strain relief member formed adjacent to the inner member of FIG. 2B in accordance with some embodiments of the invention.

FIG. 3 shows a side view of a strain relief member formed adjacent to the inner member of FIG. 2B in accordance with some embodiments of the invention. Strain relief member 300 may be constructed from any suitable material, such as, for example, plastic, ceramic, composite material, or any other suitable conductive or non-conductive material. For example, strain relief member 300 may be formed from the same material from which inner member 250 may be formed, or any other suitable flexible material operative to protect cable 400 from damage while permitting cable 400 to bend in response to an external force. Strain relief member 300 may be of any suitable shape and may extend longitudinally along cable 400. For example, between line B'-B' (FIG. 2B) and line C-C, strain relief member 300 may be cylindrical with any suitable external diameter 3*d* within the range of 0.6 millimeters to 7.6 millimeters. In some embodiments, external diameter 3*d* may be similar to second external diameter 2*d*" of inner member 250. In some embodiments, at line C-C, external diameter 3*d* may narrow such that external diameter 3*d* may be less than external diameter 2*d*' and less than external diameter 2*d*". Strain relief member 300 may be formed in the same manner as inner member 250, such as by injection molding. Strain relief member 300 and inner member 250 may be positioned substantially flush against one another to form a seam at line B'-B' and the seam between strain relief member 300 and inner member 250 may be disposed around cable 400. In some embodiments, inner member 250 and strain relief member 300 may be combined into a single component that may be formed from a single mold to protect the electrical connection between plug 200 and cable 400 while permitting cable 400 to bend in response to an external force.

Figure 4A:
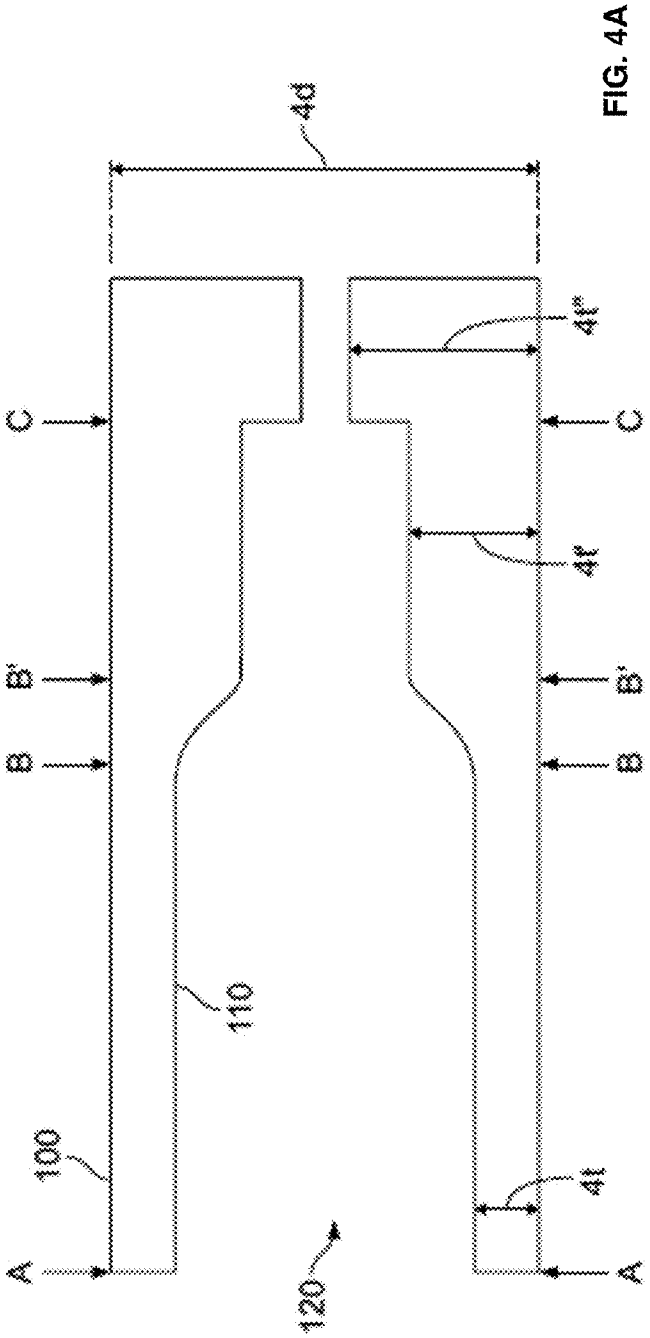
FIG. 4A shows a cross-sectional view of the cosmetic hard shell of FIG. 1 in accordance with some embodiments of the invention.

FIG. 4A shows a cross-sectional view of outer shell 100 (FIG. 1) in accordance with some embodiments of the invention. Outer shell 100 may be of a cylindrical shape with any suitable external diameter 4*d* within the range of 1.0 millimeters to 8.0 millimeters, for example 4.95 millimeters, and may have a hard, smooth external surface to present a cosmetically appealing appearance. Internal surface 110 of outer shell 100 may be formed to fit against the external surfaces of inner member 250 and strain relief member 300 to protect each of these components and the electrical connection between plug 200 and cable 400 from damage. Between line A-A and line B-B (FIG. 2A), outer shell 100 may be of any suitable thickness 4*t* within the range of 0.2 millimeters to 3.7 millimeters, for example thickness 4*t* may be equal to 0.5 millimeters. In some embodiments, thickness 4*t* may be less than 0.8 millimeters. Cavity 120 within outer shell 100 may have a diameter equal to (4*d*−2*4*t*). This diameter may be only slightly larger than external diameter 2*d*' (FIG. 2B) of inner member 250 to ensure a tight fit between outer shell 100 and inner member 250. In some embodiments, the end portion of inner member 250 disposed over plug 200 may extend beyond outer shell 100, as shown in FIG. 1.

Between line B-B and line B'-B' (FIG. 2B), cavity 120 may narrow to follow the dimensions of the external surface of inner member 250 to ensure a tight fit between outer shell 100 and inner member 250. Between line B'-B' and line C-C (FIG. 3), outer shell 100 may be of any suitable thickness 4*t*' within the range of 0.2 millimeters to 3.7 millimeters. In some embodiments, thickness 4*t*' may be less than 0.8 millimeters. Cavity 120 may have a diameter equal to (4*d*−2*4*t*') that may be only slightly larger than second external diameter 2*d*" (FIG. 2B) to ensure a tight fit between outer shell 100 and each of inner member 250 and strain relief member 300, respectively. From line C-C to the end portion of outer shell 100 that may be disposed over cable 400, outer shell 100 may be of any suitable thickness 4*t*" within the range of 0.2 millimeters to 3.7 millimeters. In some embodiments, thickness 4*t*" may be less than 0.8 millimeters. Cavity 120 may have a diameter equal to (4*d*−2*4*t*") that may be only slightly larger than external diameter 3*d* (FIG. 3) to ensure a tight fit between outer shell 100 and strain relief member 300.

In some embodiments, an adhesive may be disposed on a portion of the external surface of inner member 250 and/or a portion of the external surface of strain relief member 300 to bond outer shell 100 to inner member 250 and strain relief member 300. For example, between line B-B and line B'-B', glue, tape, or other adhesive may be disposed on inner member 250. Between line B'-B' and line C-C, glue, tape, or other adhesive may be disposed on strain member 300. No adhesive may be disposed on inner member 250 between line A-A and line B-B so that at least a portion of the adhesive disposed between line B-B and line C-C may travel onto inner member 250 between line A-A and line B-B when outer shell 100 is coupled to inner member 250 and strain relief member 300. The space between outer shell 100 and inner member 250 and strain relief member 300, respectively, may be less than 0.1 millimeters thick when outer shell 100 is coupled to inner member 250 and strain relief member 300.

In some embodiments, outer shell 100 may be disposed about inner member 250 and strain relief member 300 during manufacturing, for example using a two-shot molding process. For example, each of inner member 250 and strain relief member 300 first may be molded around the joint between plug 200 and cable 400. The combined inner member 250 and strain relief member 300 coupled to plug 200 and cable 400 may be inserted into a second mold used to form outer shell 100. Outer shell 100 may be constructed from a material having a higher melting point than that of the material or materials used to form inner member 250 and/or strain relief member 300. Exposing inner member 250 and strain relief member 300 to the melted material used to form outer shell 100 may at least partially melt the external surfaces of inner member 250 and strain relief member 300. The partially melted external surfaces may mix with the melted material used for outer shell 100, causing inner member 250 and strain relief member 300 to bond to outer shell 100 as the materials cool. The molding process may be performed quickly to ensure proper bonding of outer shell 100 to the components of the audio plug.

The external appearance of outer shell 100 may be aesthetically enhanced after outer shell 100 has been formed using any suitable method. For example, the external surface of outer shell 100 may be polished or sanded to remove any surface imperfections and to improve the smoothness of outer shell 100. Alternatively, a coating may be applied to the external surface of outer shell 100 to give outer shell 100 a glossy finish or a matte finish depending on the desired cosmetic appearance.

Figure 4B:
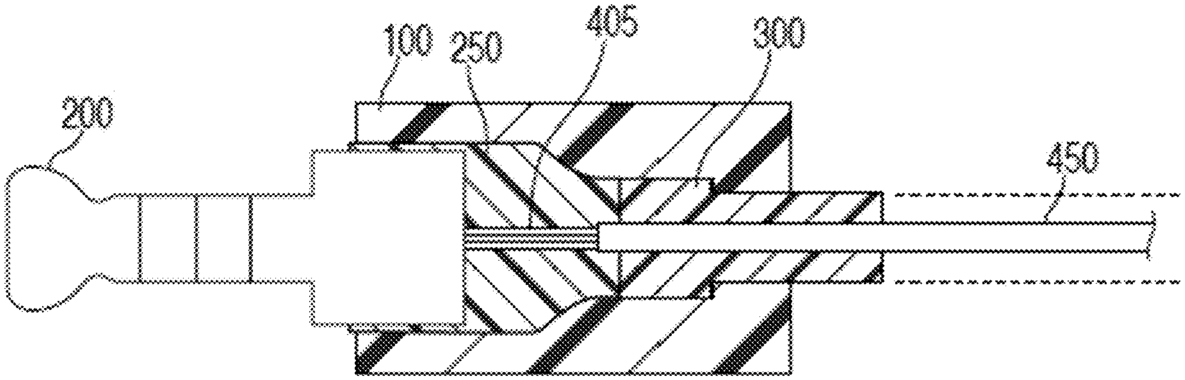
FIG. 4B shows a cross-sectional view of the audio plug of FIG. 1 in accordance with some embodiments of the invention.
Figure 5:
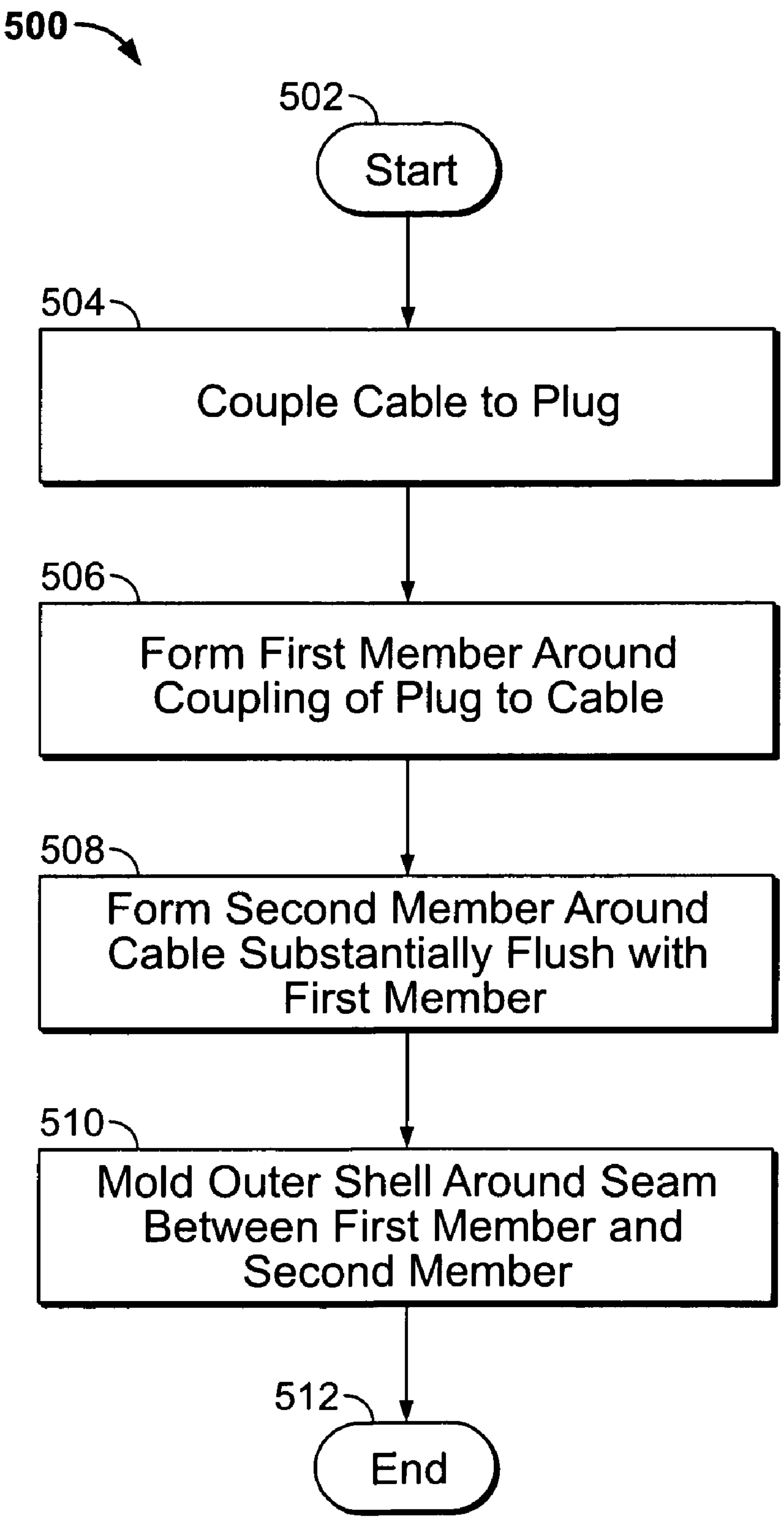
FIG. 5 is a flowchart of an illustrative process for assembling an audio plug with a cosmetic hard shell in accordance with some embodiments of the invention.

FIG. 4B shows a cross-sectional view of the audio plug of FIG. 1 in accordance with some embodiments of the invention. Audio plug 100 can include inner member 250 and strain relief member 300 positioned around cable 400, wires 405 and plug 200. Outer shell 100 is positioned around inner member 250 and strain relief member 300 such that the ends of shell 100 are contained within the edges of inner member 250 and strain relief member 300. FIG. 5 is a flowchart of an illustrative process for assembling an audio plug with a cosmetic hard shell in accordance with some embodiments of the invention. Process 500 may begin at step 502. At step 504, a plug may be coupled to a cable using any suitable process. For example, plug 200 may be soldered to cable 400 (FIG. 2A). At step 506, a first member may be molded around the coupling of the plug to the cable using any suitable method. For example, inner member 250 (FIG. 2B) may be disposed around a portion of plug 200 and a portion of cable 400 using injection molding to protect the electrical connection between plug 200 and cable 400. Process 500 may advance to step 508, where a second member may be molded around a portion of the cable using any suitable method so as to form a seam with and be substantially flush with an end of the first member molded around the cable. For example, strain relief member 300 (FIG. 3) may be disposed around a portion of cable 400 using injection molding to protect cable 400 from damage while permitting cable 400 to bend in response to an external force. Strain relief member 300 may be molded so as to be adjacent to and substantially flush with inner member 250. At step 510, a hard, smooth outer shell may be molded around the seam between the first member and the second member to protect the audio plug and to provide a cosmetically appealing appearance. For example, outer shell 100 (FIG. 4A) may be disposed around the seam between inner member 250 and strain relief member 300 using a two-shot molding process. As another example, outer shell 100 may be disposed around the seam between inner member 250 and strain relief member 300 using an adhesive disposed on at least a portion of the external surface of inner member 250 and disposed on at least a portion of the external surface of strain member 300. Process 500 may then advance to step 512 and end.

While there have been described apparatus, systems and methods for assembling an audio plug with a cosmetic hard shell, it is to be understood that many changes may be made therein without departing from the spirit and scope of the invention. It will also be understood that various directional and orientational terms such as "up" and "down," "left" and "right," "top" and "bottom," "side" and "edge" and "corner," "height" and "width" and "depth," "horizontal" and "vertical," and the like are used herein only for convenience, and that no fixed or absolute directional or orientational limitations are intended by the use of these words. For example, the positioning of an inner member, a strain relief member, and an outer shell in this invention can have any desired orientation. If reoriented, different directional or orientational terms may need to be used in their description, but that will not alter their fundamental nature as within the scope of the invention. Those skilled in the art will appreciate that the invention can be practiced by other than the described embodiments, which are presented for purposes of illustration rather than of limitation, and the invention is limited only by the claims which follow.

What is claimed is:

1. An audio plug comprising:

a plug coupled to a cable to form a coupling joint;

a first member disposed about the coupling joint, the first member comprising a first inner component and a second inner component, wherein the first inner component comprises a plug end disposed about at least a portion of the plug and a cable end disposed about at least a portion of the cable; and the second inner component comprises a first end disposed about at least a first portion of the cable and a second end disposed about a second portion of the cable, wherein the cable end of the first inner component at least axially abuts the first end of the second inner component such that the first inner component and second inner component do not overlap axially; and an outer shell disposed over at least a portion of the first inner component and the second inner component of the first member.

2. The audio plug of claim 1, wherein the diameter of the plug equals 3.5 millimeters.

3. The audio plug of claim 1, wherein the diameter of the first member varies along the length of the first member in the range of 0.6 millimeters to 7.6 millimeters.

4. The audio plug of claim 1, wherein the first member is more flexible than the outer shell and wherein the first member extends beyond the edge of the outer shell disposed in proximity of the cable.

5. The audio plug of claim 1, further comprising an adhesive disposed on at least a portion of the external surface of the first member for coupling the outer shell to the first member.

6. The audio plug of claim 1, wherein the diameter of the outer shell is in the range of 1.0 millimeters to 8.0 millimeters.

7. The audio plug of claim 6, wherein the diameter of the outer shell equals 4.95 millimeters.

8. The audio plug of claim 1, wherein the outer shell further comprises a shell thickness in the range of 0.2 millimeters to 3.7 millimeters.

9. The audio plug of claim 8, wherein the shell thickness is less than 0.8 millimeters.

10. The audio plug of claim 8, wherein the shell thickness equals 0.5 millimeters.

11. The audio plug of claim 8, wherein the shell thickness varies within the outer shell.

12. A method for assembling an audio plug, the method comprising:

coupling a plug to a cable to form a coupling joint;

forming a first member about the coupling joint, the first member comprising a first end disposed around at least a portion of the cable and a second end disposed around at least a portion of the plug; and placing an outer shell over at least a portion of the first member, wherein the ends of the outer shell are confined within the first and second ends of the first member.

13. The method of claim 12 further comprising:

disposing an adhesive on a portion of the surface of the first member before disposing the outer shell about the portion of the first member.

14. The method of claim 12, wherein a space between the surface of the first member and the outer shell has a thickness of less than 0.1 millimeters in order to accommodate the adhesive.

15. The method of claim 12, wherein the outer shell further comprises a shell thickness that varies within the outer shell.

16. The method of claim 12, wherein the first member is formed from a material that is more flexible than the outer shell.

17. The method of claim 12 wherein:

the first member is constructed from a flexible material operative to deflect and provide strain relief for the cable; and the outer shell is constructed from a rigid material that does not flex.

18. The method of claim 12 wherein the outer shell is formed from a hard material with a smooth cosmetic appearance.

19. The method of claim 12 wherein the hard material of the outer shell is plastic.

20. The method of claim 12 wherein:

forming a first member about the coupling joint includes forming a first inner component about the coupling joint and a second inner component about the cable, wherein the second inner component is formed next to the first inner component such that the second inner component extends axially from the end of the first inner component; and placing an outer shell over at least a portion of the first member includes placing the outer shell over the interface found between the first and second inner components.

21. The method of claim 12, wherein placing further comprises:

molding the outer shell over at least a portion of the first member.

22. The method of claim 21, wherein the outer shell further comprises a first material with a first melting point and wherein the first melting point of the outer shell is higher than the melting point of the first member.

23. An audio plug comprising:

a plug coupled to a cable to form a coupling joint;

a first member disposed about the coupling joint, the first member comprising a first end disposed around at least a portion of the plug and a second end disposed around at least a portion of the cable; and an outer shell formed from a hard plastic material with a smooth cosmetic appearance and disposed about at least a portion of the first member, wherein the ends of the outer shell are confined within the first and second ends of the first member.

24. The audio plug of claim 23, wherein the diameter of the first end is less than the diameter of the second end.

25. The audio plug of claim 23, wherein the second inner component is formed from a flexible material and the outer shell is formed from a rigid material.

26. The audio plug of claim 23, wherein the outer shell is formed from a hard plastic material.

27. The audio plug of claim 23, wherein the first member further comprises a first inner component comprising the first end and a first component opposite end, and a second inner component comprising the second end and a second component opposite end, the first inner component formed over the coupling joint and the second inner component formed over the cable, wherein the first component opposite end is axially adjacent to the second component opposite end, and wherein the outer member covers the interface found between the first component opposite end and the second component opposite end.

28. The audio plug of claim 27, wherein the diameter of the second end is less than the diameter of the second component opposite end.

29. The audio plug of claim 23, wherein each of the first member and the outer shell are formed by a two-shot molding process.

30. The audio plug of claim 29, wherein the outer shell further comprises a first material with a first melting point and wherein the first melting point of the outer shell is higher than the melting point of the first member.

* * * * *

UNITED STATES PATENT AND TRADEMARK OFFICE

CERTIFICATE OF CORRECTION

PATENT NO. : 7,833,055 B2
APPLICATION NO. : 12/218450
DATED : November 16, 2010
INVENTOR(S) : Wilhelmus M. C. Crooijmans et al.

It is certified that error appears in the above-identified patent and that said Letters Patent is hereby corrected as shown below:

In column 2, line 2, delete “member opposing” and insert -- member. Opposing --, therefor.

Signed and Sealed this
Twenty-fourth Day of April, 2012

David J. Kappos

*Director of the United States Patent and Trademark Office*